(12) United States Patent
Sugimoto et al.

(10) Patent No.: US 10,509,051 B2
(45) Date of Patent: Dec. 17, 2019

(54) PHYSICAL QUANTITY SENSOR AND MANUFACTURING METHOD THEREFOR

(71) Applicant: DENSO CORPORATION, Kariya, Aichi-pref. (JP)

(72) Inventors: Kiyomasa Sugimoto, Kariya (JP); Naoki Yoshida, Kariya (JP)

(73) Assignee: DENSO CORPORATION, Kariya (JP)

( * ) Notice: Subject to any disclaimer, the term of this patent is extended or adjusted under 35 U.S.C. 154(b) by 51 days.

(21) Appl. No.: 15/537,665

(22) PCT Filed: Jan. 7, 2016

(86) PCT No.: PCT/JP2016/000058
§ 371 (c)(1),
(2) Date: Jun. 19, 2017

(87) PCT Pub. No.: WO2016/117289
PCT Pub. Date: Jul. 28, 2016

(65) Prior Publication Data
US 2018/0095106 A1    Apr. 5, 2018

(30) Foreign Application Priority Data
Jan. 21, 2015   (JP) .................................... 2015-9653

(51) Int. Cl.
*G01P 15/125*    (2006.01)
*H01L 23/48*    (2006.01)
(Continued)

(52) U.S. Cl.
CPC .......... *G01P 15/125* (2013.01); *B81B 3/0018* (2013.01); *B81B 7/007* (2013.01);
(Continued)

(58) Field of Classification Search
CPC ............. G01P 15/08; G01P 2015/0814; G01P 15/125; G01P 2015/0822;
(Continued)

(56) References Cited

U.S. PATENT DOCUMENTS 5,554,806 A * 9/1996 Mizuno ................... G01P 1/023
73/493
2003/0164043 A1* 9/2003 Murata ................ G01P 15/125
73/514.32
(Continued)

FOREIGN PATENT DOCUMENTS

JP    9-145512 A    6/1997
JP    3316555 B2    8/2002
(Continued)

*Primary Examiner* — Herbert K Roberts
(74) *Attorney, Agent, or Firm* — Posz Law Group, PLC

(57) ABSTRACT

A physical quantity sensor includes: a detection element that outputs a sensor signal in accordance with a physical quantity; and a mount member. The detection element includes a sensor portion that has a first surface, includes a movable electrode, and a fixed electrode, and outputs the sensor signal, and a cap portion that has a first surface and is bonded with the sensor portion. Each of the first surface of the sensor portion and the first surface of the cap portion is mounted on the mount member, and the detection element detects the physical quantity. An electrode, which is connected with the movable electrode and connected with a circuit portion, and an electrode, which is connected with the fixed electrode and connected with the circuit portion, are provided on a side surface continued to the first surface of the cap portion.

7 Claims, 20 Drawing Sheets

(51) Int. Cl.
*B81B 7/00* (2006.01)
*H01L 29/84* (2006.01)
*B81B 3/00* (2006.01)
*B81C 3/00* (2006.01)

(52) U.S. Cl.
CPC ............... *B81C 3/00* (2013.01); *H01L 29/84* (2013.01); *H01L 2224/48091* (2013.01); *H01L 2224/48137* (2013.01); *H01L 2224/49109* (2013.01); *H01L 2224/73265* (2013.01)

(58) Field of Classification Search
CPC ............... G01P 2015/0837; B81B 2201/0235; B81B 3/0018; B81C 3/00; H01L 29/84; H01L 2224/48091; H01L 2224/48137; H01L 2224/49109; H01L 2224/73265
USPC ....................................................... 73/514.32
See application file for complete search history.

(56) References Cited

U.S. PATENT DOCUMENTS

2010/0148341 A1* 6/2010 Fuji .................. B81B 7/007
 257/686
2011/0290023 A1* 12/2011 Takagi ............... G01C 19/5783
 73/514.32
2012/0186347 A1 7/2012 McNeil

FOREIGN PATENT DOCUMENTS

| JP | 2007-184355 A | 7/2007 |
| JP | 2013-183083 A | 9/2013 |
| JP | 2013-183115 A | 9/2013 |

* cited by examiner

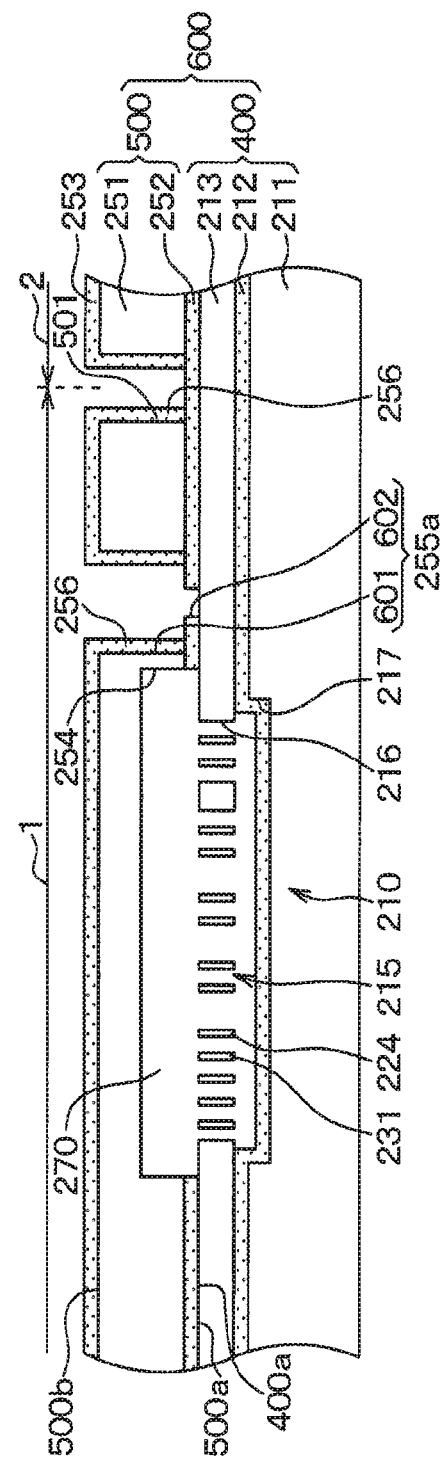

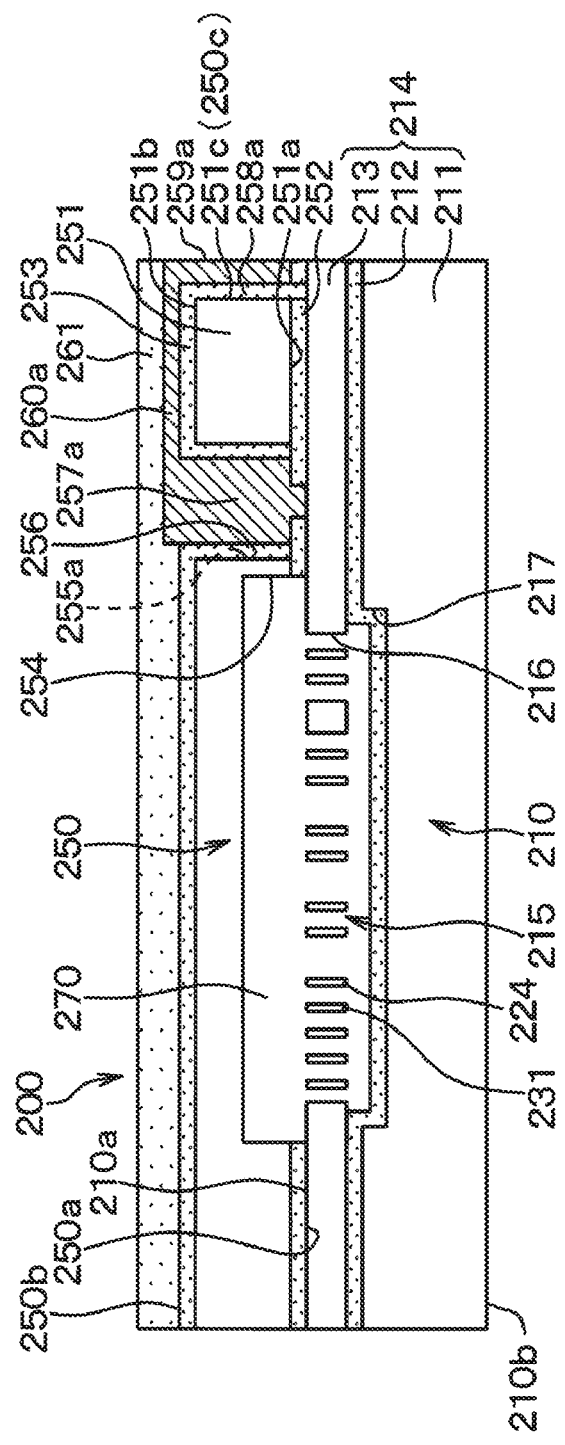

PHYSICAL QUANTITY SENSOR AND MANUFACTURING METHOD THEREFOR

CROSS REFERENCE TO RELATED APPLICATIONS

This application is a U.S. national stage of International Patent Application No. PCT/JP2016/000058 filed on Jan. 7, 2016 and is based on Japanese Patent Application No. 2015-9653 filed on Jan 21, 2015, the contents of which are incorporated herein by reference.

TECHNICAL FIELD

The present disclosure relates to a physical quantity sensor including a mount member and a detection element mounted on the mount member to output a sensor signal in accordance with a physical quantity, and also relates to a manufacturing method of the physical quantity sensor.

BACKGROUND ART

An acceleration detection element has been proposed, which includes a movable portion over a support substrate, the movable portion being separated from the support substrate by a predetermined distance and capable of rotation (seesaw motion) in accordance with acceleration in a normal direction to a surface direction of the support substrate (refer to, for example, Patent Literature 1).

Specifically, in such an acceleration detection element, the movable portion includes a frame portion having a rectangular shape formed with an opening inside, and a torsion beam that is provided in the frame portion so as to divide the opening, and becomes a rotational axis at the time of rotation of the movable portion. The torsion beam is supported on the support substrate via an anchor portion, to be provided over the support substrate. Further, the frame portion is formed in an asymmetrical shape with respect to the torsion beam, such that the frame portion (movable portion) can rotate about the torsion beam serving as the rotational axis upon application of the acceleration in the normal direction to the surface direction of the support substrate. In detail, when one site formed by division by the torsion beam is referred to as a first site and the other site is referred to as a second site, a length (first length) from the torsion beam to the end of the first site on the opposite side to the torsion beam side is made longer than a length (second length) from the torsion beam to the end of the second site on the opposite side to the torsion beam side. That is, a mass of the first site is made larger than a mass of the second site in the frame portion.

Further, the support substrate is provided with a fixed electrode that constitutes a predetermined capacitance together with the first site, and a fixed electrode that constitutes a predetermined capacitance together with the second site. That is, the first site and the second site function as movable electrodes.

The acceleration detection element as thus described is disposed on one surface of a mount member such that the surface direction of the support substrate is parallel to the surface direction of the mount member, to thereby constitute an acceleration sensor. When acceleration is applied in a normal direction to the surface direction of the one surface of the mount member (one surface of the support substrate), the movable portion rotates about the torsion beam serving as the rotational axis. Therefore, a capacitance between the movable portion and the fixed electrode changes in accordance with the acceleration. Accordingly, the acceleration in the normal direction to the one surface of the mount member is detected by detecting a change in capacitance.

PRIOR ART LITERATURE

Patent Literature

Patent Literature 1: JP 2012-154919 A

SUMMARY OF INVENTION

According to the acceleration sensor (acceleration detection element) as described above, since the movable electrode (movable portion) and the fixed electrode are formed on different planes, when distortion or durability variation occurs due to a temperature change or the like, a deformation quantity may be different for each of the movable electrode and the fixed electrode, and characteristic variation may tend to occur.

Therefore, the present inventors have conducted studies on an acceleration sensor in which an acceleration detection element is used which includes a sensor portion having one surface and formed with a movable electrode on the one surface side, and a fixed electrode opposing the movable electrode in a surface direction of the one surface, and the acceleration detection element is mounted on one surface of a mount member such that the one surface is orthogonal to the one surface of the sensor portion. By disposing the acceleration detection element in the mount member in this manner, a physical quantity in the normal direction to the one surface of the mount member can be detected in the sensor portion. Further, with the movable electrode and the fixed electrode arranged in the surface direction of the one surface of the sensor portion (the same plane), when distortion or durability variation occurs, a difference in deformation quantity between the fixed electrode and the fixed electrode can be reduced to inhibit the reduction in detection accuracy.

According to an acceleration sensor, while the movable electrode and the fixed electrode formed on one surface side of the sensor portion, an electrode being in the acceleration detection element and connected to an external circuit is normally formed on the one surface of the sensor portion. That is, the electrode is formed on the surface orthogonal to the one surface of the mount member. Thus, for example, when a circuit board is disposed on the one surface of the mount member and connected with the sensor portion via a conductive member, surface directions in which the sensor portion and the circuit board are connected are different, and a process for the connection may tend to be complicated.

It is an object of the present disclosure to provide a physical quantity sensor and a manufacturing method therefor, which are capable of inhibiting the complexity of connection with an external circuit and making characteristic variation unlikely to occur.

A physical quantity sensor according to one example of the present disclosure includes: a detection element that outputs a sensor signal in accordance with a physical quantity; and a mount member on which the detection element is mounted.

The detection element includes a sensor portion that has a first surface, includes a movable electrode that is displaceable in a surface direction of the first surface in accordance with a physical quantity, and a fixed electrode that is disposed to oppose the movable electrode in the surface direction of the first surface, and outputs the sensor signal based on a capacitance between the movable electrode and the fixed electrode, and a cap portion that has a first surface and is bonded with the sensor portion in a state where the first surface opposes the first surface of the sensor portion. Each of the first surface of the sensor portion and the first surface of the cap portion is mounted on the mount member so as to be orthogonal to a first surface of the mount member, and the detection element detects the physical quantity in a normal direction to the first surface of the mount member. An electrode, which is electrically connected with the movable electrode and electrically connected with a circuit portion to perform predetermined process, and an electrode, which is electrically connected with the fixed electrode and electrically connected with the circuit portion, are provided on a side surface continued to the first surface of the cap portion and parallel to the first surface of the mount member.

Accordingly, the movable electrode and the fixed electrode are disposed to oppose each other in the surface direction of the sensor portion and located on the same plane. When distortion or durability variation occurs due to a temperature change or the like, it may be possible to inhibit the difference in deformation quantity between the movable electrode and the fixed electrode, and make characteristic variation unlikely to occur.

Further, the detection element is mounted on the mount member such that the one surface of the sensor portion and the one surface of the cap portion are orthogonal to the one surface of the mount member, and a physical quantity in the normal direction to the one surface of the mount member can be detected. The electrode is formed on the side surface of the detection element which is parallel to the one surface of the mount member. Thus, for example, when a circuit board as the circuit portion is disposed on the one surface of the mount member and the circuit board is connected with the sensor portion via a conductive member, surface directions of connected sections of the detection element and the circuit board can be made the same, to facilitate the connection between the detection element and the circuit board.

A manufacturing method of the physical quantity sensor according to another aspect of the present disclosure includes: preparing a stacked wafer in which a first wafer that is divided to configure the sensor portion and a second wafer that is divided to configure the cap portion are bonded together, and the movable electrode and the fixed electrode are provided in each of a plurality of chip formation regions, while the plurality of chip formation regions are partitioned by a dicing line; dicing the stacked wafer along the dicing line to form the detection element having the sensor portion and the cap portion; mounting the detection element on the first surface of the mount member such that each of the first surface of the sensor portion and the first surface of the cap portion is orthogonal to the first surface of the mount member, and the physical quantity in the normal direction to the first surface of the mount member is detected; and forming a hole portion astride the chip formation regions and the dicing line on the second wafer and forming a metal film in the hole portion, after the preparation of the stacked wafer. In the formation of the detection element, the dicing is performed to divide the hole portion and the metal film, to form the electrode on the side surface continued to the first surface of the cap portion in the detection element.

Accordingly, it may be possible to manufacture a detection element including an electrode on the side surface continued to one surface of the cap portion. Hence the detection element is mounted on the one surface of the mount member such that the side surface is parallel to the one surface of the mount member, and for example when the circuit board as the circuit portion is disposed on the one surface of the mount member and the circuit board is connected with the sensor portion via the conductive member, the surface directions of the connected sections of the detection element and the circuit board can be made the same, to facilitate the connection between the detection element and the circuit board.

BRIEF DESCRIPTION OF DRAWINGS

The above and other objects, features and advantages of the present disclosure will become more apparent from the following detailed description made with reference to the accompanying drawings. In the drawings:

FIG. 7B is a sectional view showing the manufacturing process following FIGS. 6A to 6D;

FIG. 8A is a sectional view showing the manufacturing process following FIGS. 7A to 7C;

DESCRIPTION OF EMBODIMENTS

Embodiments of the present disclosure are described below with reference to the drawings. Note that portions same or similar to each other in the respective following embodiments are provided with the same reference sign for description.

(First Embodiment)

A first embodiment is described with reference to the drawings. In the present embodiment, a description is given of an example where a physical quantity sensor of the present disclosure is applied to an acceleration sensor for detecting acceleration.

Figure 1:
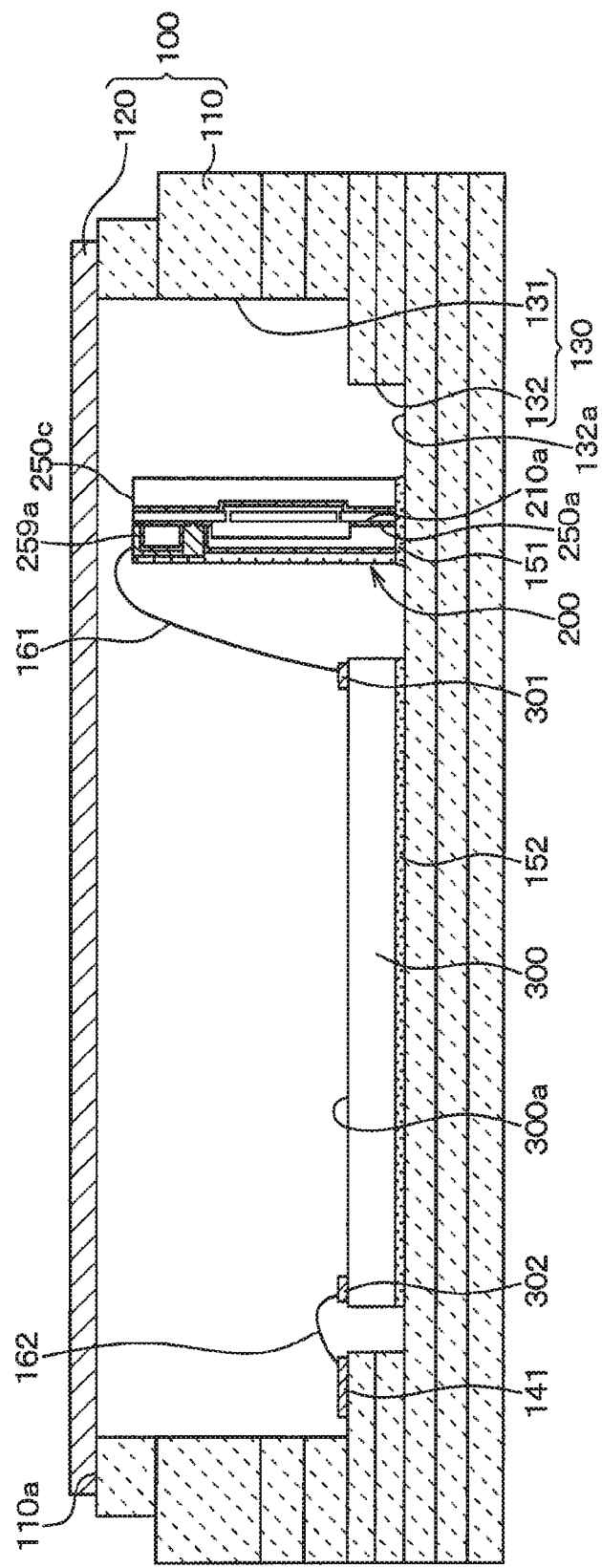
FIG. 1 is a sectional view of an acceleration sensor in a first embodiment of the present disclosure.
Figure 2:
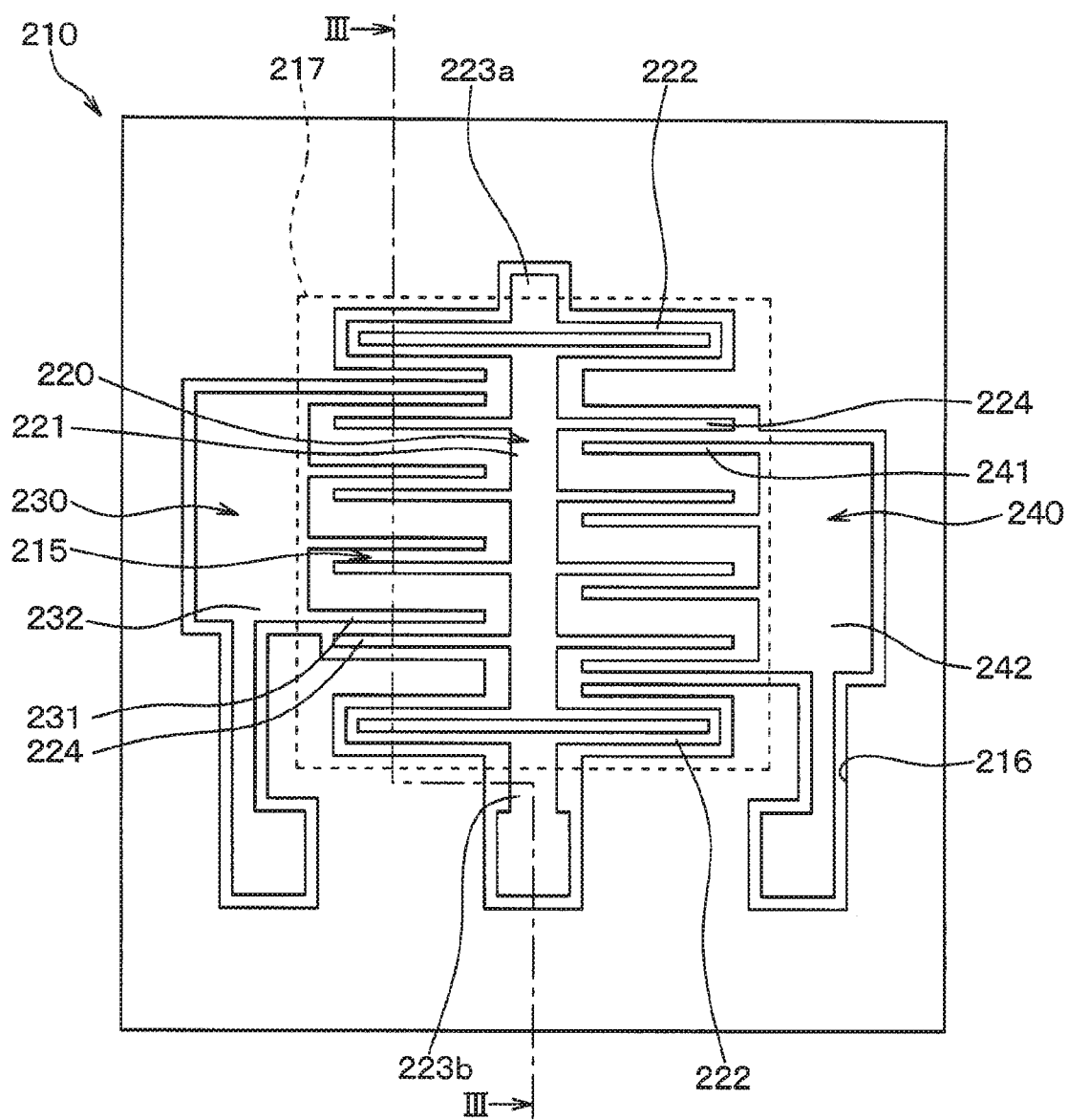
FIG. 2 is a plan view of a sensor portion in an acceleration detection element.
Figure 3:
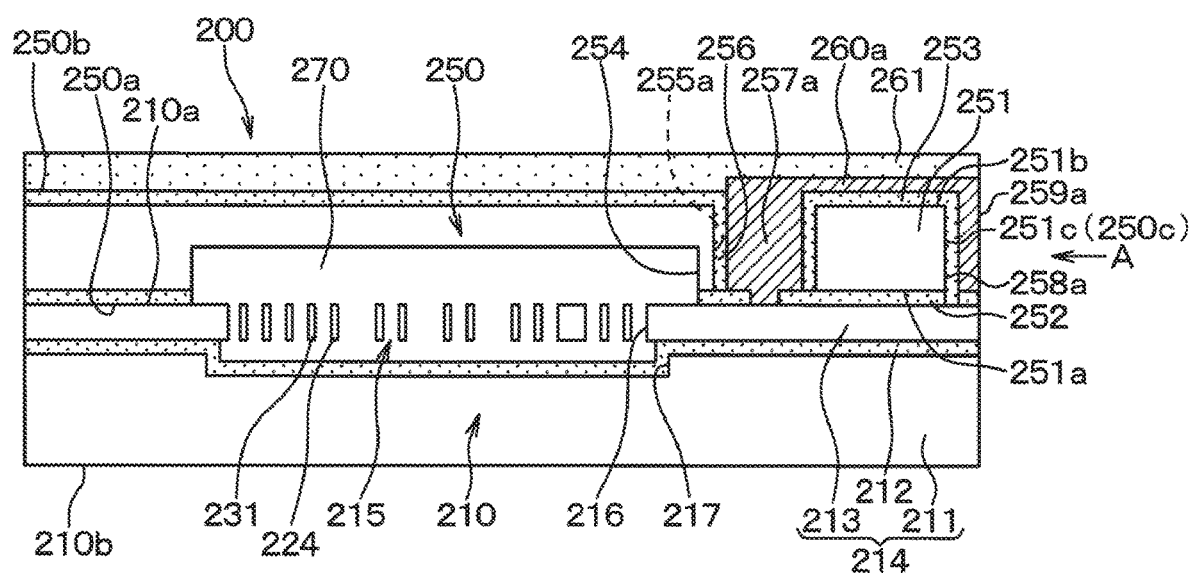
FIG. 3 is a sectional view along line III-III in FIG. 2.

As shown in FIG. 1, the acceleration sensor is configured by mounting, on a package 100 as a mount member, an acceleration detection element 200 for outputting a sensor signal in accordance with acceleration, and a circuit board 300 for performing predetermined process on the acceleration detection element 200. First, a configuration of the acceleration detection element 200 of the present embodiment is described. The acceleration detection element 200 of the present embodiment has a package structure including a sensor portion 210 and a cap portion 250 as shown in FIGS. 2 and 3. The package 100 corresponds to a mount member of the present disclosure, and the acceleration detection element 200 corresponds to a detection element of the present disclosure.

The sensor portion 210 includes a silicon-on-insulator (SOI) substrate 214 in which a support substrate 211, an insulating film 212, and a semiconductor layer 213 are sequentially stacked, and which has one surface 210a configured on the semiconductor layer 213, while having a rectangular shape as seen in plan view. Note that the support substrate 211 and the semiconductor layer 213 are made up of a silicon substrate or the like, and the insulating film 212 is made up of an oxidized film or the like. Further, the other surface 210b of the sensor portion 210 is configured on the support substrate 211. The one surface 210a is also referred to as a first surface of the detection element.

The SOI substrate 214 is processed by known micromachining, to be formed with a sensing portion 215. Specifically, in the semiconductor layer 213, a groove 216 is formed to form a movable portion 220 and first and second fixed portions 230, 240 each having a beam structure in a comb-teeth shape, and the sensing portion 215 for outputting a sensor signal in accordance with acceleration is formed by the beam structure.

In the support substrate 211, a site corresponding to the formation region for multiple beam structures is removed in a rectangular shape to form a concave portion 217. Thereby, predetermined regions of the movable portion 220 and the first and second fixed portions 230, 240 of the semiconductor layer 213 are in the state of being released from the support substrate 211.

In the present embodiment, the insulating film 212 is also formed on the wall surface of the concave portion 217, but it may not be formed on the wall surface of the concave portion 217. Further, the concave portion 217 may not be formed in the support substrate 211, but an opening may be formed in the site of the insulating film 212 which corresponds to the formation region of the beam structures, to allow predetermined regions of the movable portion 220 and the first and second fixed portions 230, 240 to be released from the support substrate 211.

The movable portion 220 is disposed so as to pass across the concave portion 217, and configured such that both longitudinal ends of a rectangular weight portion 221 are integrally coupled to anchor portions 223a, 223b via a beam portion 222. The anchor portions 223a, 223b are supported on the support substrate 211 via the insulating film 212 in an opening edge of the concave portion 217. Hence the weight portion 221 and the beam portion 222 are in the state of facing the concave portion 217. The sensor portion 210 in FIG. 3 corresponds to a cross section along line III-III in FIG. 2.

The beam portion 222 is formed in a rectangular frame shape with two parallel beams coupled at both ends thereof, and has a spring function to be displaced in a direction orthogonal to the longitudinal direction of the two beams. Specifically, the beam portion 222 displaces the weight portion 221 in the longitudinal direction upon reception of acceleration containing a component of the direction along the longitudinal direction of the weight portion 221, and returns the weight portion 221 to the original state in accordance with disappearance of the acceleration. Thus, when acceleration is applied, the weight portion 221 coupled to the support substrate 211 via the beam portion 222 as thus described is displaced in the direction in which the beam portion 222 is displaced.

Further, the movable portion 220 includes multiple movable electrodes 224 integrally formed to protrude from both side surfaces of the weight portion 221 in mutually opposite directions and in the direction orthogonal to the longitudinal direction of the weight portion 221. In FIG. 2, four movable electrodes 224 are formed to protrude from each of the left side and the right side of the weight portion 221, and are in the state of facing the concave portion 217. Further, each movable electrode 224 is integrally formed with the weight portion 221 and the beam portion 222, and by displacement of the beam portion 222, each movable electrode 224 can be displaced together with the weight portion 221 in the longitudinal direction of the weight portion 221.

The first and second fixed portions 230, 240 are supported on the support substrate 211 via the insulating film 212 on opposite sides of the opening edges of the concave portion 217, on which the anchor portions 223a, 223b are not supported. That is, the first and second fixed portions 230, 240 are disposed so as to sandwich the movable portion 220. The first fixed portion 230 is disposed on the left side of FIG. 2 with respect to the movable portion 220, and the second fixed portion 240 is disposed on the right side of FIG. 2 with respect to the movable portion 220. The first and second fixed portions 230, 240 are electrically independent from each other.

Further, the first and second fixed portions 230, 240 include: multiple first and second fixed electrodes 231, 241 disposed to oppose each other in a parallel state such that each of the fixed electrodes and the side surface of the movable electrode 224 form a predetermined detection interval; and first and second wiring portions 232, 242 supported on the support substrate 211 via the insulating film 212. That is, the movable electrode 224 and the first and second fixed electrodes 231, 241 are both formed in the semiconductor layer 213, to be formed on the same plane.

In the present embodiment, as shown in FIG. 2, the four first fixed electrodes 231 and the four second fixed electrodes 241 are formed and arranged in the comb-teeth shape so as to be engaged with the comb teeth of the movable electrode 224. The first and second fixed electrodes 231, 241 are supported on the respective wiring portions 232, 242 in a cantilever manner to be in the state of facing the concave portion 217. The above is the configuration of the sensor portion 210 in the present embodiment.

As shown in FIG. 3, the cap portion 250 has the same rectangular shape as the sensor portion 210 as seen in plan view, and has one surface 250a and the other surface 250b that is on the opposite side to the one surface 250a. The one surface 250a is bonded with the one surface 210a of the sensor portion 210. Specifically, the cap portion 250 includes: a substrate 251 having one surface 251a and the other surface 251b on the opposite side to the one surface 251a; an insulating film 252 formed on the one surface 251a of the substrate 251 on the SOI substrate 214 side; and an insulating film 253 formed on the other surface 251b of the substrate 251. The insulating film 252 formed on the one surface 251a of the substrate 251 configures the one surface 250a of the cap portion 250, and the insulating film 252 is bonded with the semiconductor layer 213 (the one surface 210a of the sensor portion 210) by direct bonding. The other surface 250b of the cap portion 250 is made up of the insulating film 253. The one surface 250a is also referred to as a first surface of the cap portion, and the other surface 250b is also referred to as a second surface of the cap portion.

The substrate 251 is formed using a silicon substrate or the like having a rectangular shape as seen in plan view, and a recess 254 is formed in a section of the one surface 251a which opposes the section where the movable portion 220 and the first and second fixed portions 230, 240 are released from the support substrate 211. This recess 254 is to inhibit the section, where the movable portion 220 and the first and second fixed portions 230, 240 are released from the support substrate 211, from coming into contact with the cap portion 250. Although FIG. 3 shows the recess 254 with no insulating film 252 formed on the wall surface, the insulating film 252 may be formed on the wall surface of the recess 254.

By formation of the recess 254 in the substrate 251, an airtight chamber 270 is configured in a space including the recess 254 between the sensor portion 210 and the cap portion 250, and the sensing portion 215 formed in the sensor portion 210 is sealed in an airtight manner in the airtight chamber 270. In the present embodiment, the airtight chamber 270 has atmospheric pressure.

Figure 4:
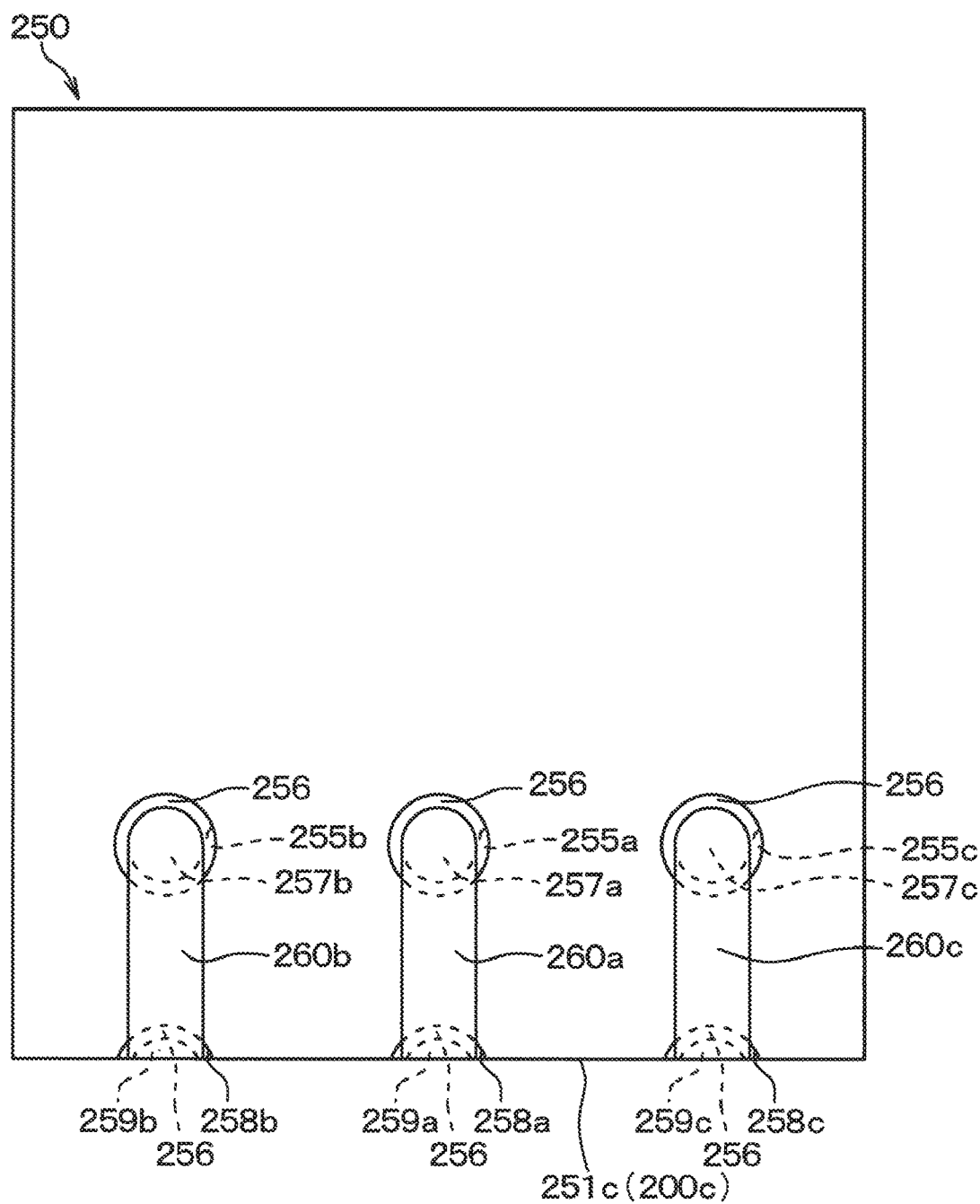
FIG. 4 is a plan view of a cap portion.

Further, as shown in FIGS. 3 and 4, the cap portion 250 is formed with multiple through holes 255a to 255c that penetrate the cap portion 250 in a stacking direction of the cap portion 250 and the sensor portion 210 (hereinafter simply referred to as a stacking direction). Specifically, the through hole 255a is formed so as to expose the anchor portion 223b, and the through holes 255b, 255c are formed so as to respectively expose predetermined places of the first and second wiring portions 232, 242. An insulating film 256 made up of TEOS (Tetra Ethyl Ortho Silicate) or the like is formed on the wall surfaces of the through holes 255a to 255c. Through electrodes 257a to 257c made up of Al or the like are formed on the insulating film 256 so as to be electrically connected as appropriate with the anchor portion 223b and the first and second wiring portions 232, 242.

Figure 5:
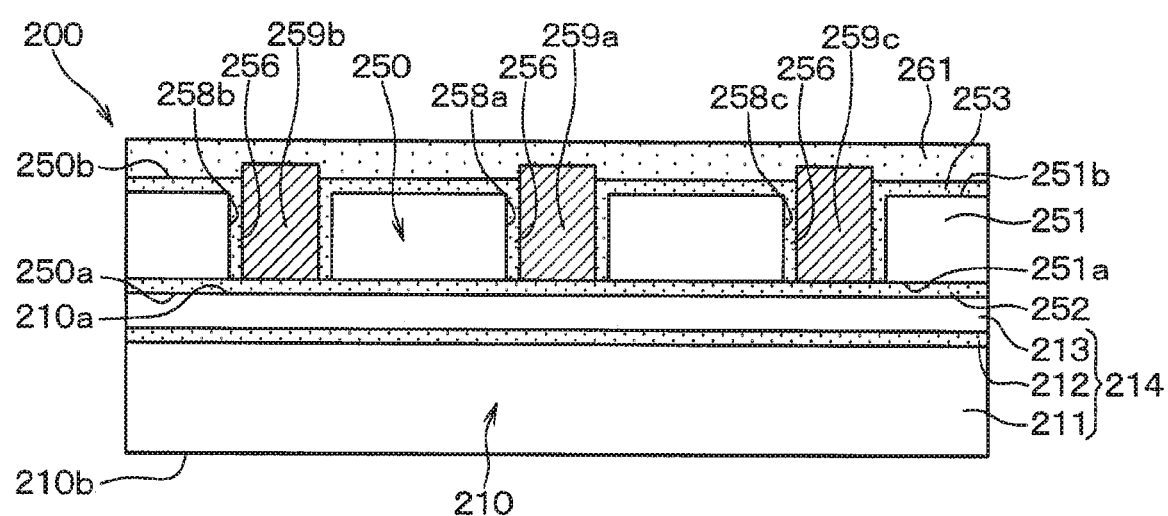
FIG. 5 is a view seen from a direction A in FIG. 3.

Further, as shown in FIGS. 3 to 5, the substrate 251 (cap portion 250) has two side surfaces orthogonal to the arranging direction of the movable electrode 224 and the first and second fixed electrodes 231, 241 (the longitudinal direction of the weight portion 221 and the crosswise direction of FIG. 3). Three grooves 258a to 258c are formed on a side surface 251c (250c) on the anchor portion 223b side out of the two side surfaces, along the stacking direction. The insulating film 256 made up of TEOS or the like is formed on the wall surfaces of the grooves 258a to 258c as on the through holes 255a to 255c, and electrodes 259a to 259c made up of Al or the like are formed on the insulating film 256.

Wiring layers 260a to 260c for electrically connecting between the through electrodes 257a to 257c and the electrodes 259a to 259c are respectively formed on the insulating film 253. That is, the electrode 259a is electrically connected to the movable electrode 224 (anchor portion 223b) via the wiring layer 260a and the through electrode 257a. The electrode 259b is electrically connected to the first fixed electrode 231 (first wiring portion 232) via the wiring layer 260b and the through electrode 257b. The electrode 259c is electrically connected to the second fixed electrode 241 (second wiring portion 242) via the wiring layer 260c and the through electrode 257c.

In the present embodiment, the anchor portion 223b corresponds to a movable-electrode connection portion of the present disclosure, and the first and second wiring portions 232, 242 correspond to a fixed-electrode connection portion of the present disclosure. Further, the through hole 255a corresponds to a movable-electrode through hole of the present disclosure, the through hole 257a corresponds to a movable-electrode through electrode of the present disclosure, the through holes 255b, 255c correspond to a fixed-electrode through hole of the present disclosure, and the through electrode 257b, 257c correspond to a fixed-electrode through electrode of the present disclosure. The wiring layer 260a corresponds to a movable-electrode wiring portion of the present disclosure, and the wiring layers 260b, 260c corresponds to a fixed-electrode wiring portion of the present disclosure.

Further, a protective film 261 is formed on the insulating film 253, the protective film 261 covering and protecting each of the through electrodes 257a to 257c and the wiring layers 260a to 260c. Note that the protective film 261 is not illustrated in FIG. 4. FIG. 5 is a view seen from a direction A in FIG. 3. FIG. 5 is not a sectional view, but is hatched for facilitation of understanding.

The above is the configuration of the acceleration detection element 200. In the acceleration detection element 200 as thus described, when acceleration is applied in the direction along the arranging direction of the movable electrode 224 and the first and second fixed electrodes 231, 241 (one direction out of the surface direction of the one surface 210a of the sensor portion 210, as well as the direction along the longitudinal direction of the weight portion 221), the weight portion 221 is displaced in accordance with the acceleration, leading to a change in capacitance between the movable electrode 224 and each of the first and second fixed electrodes 231, 241. Hence the capacitance is outputted as a sensor signal.

The circuit board 300 is obtained by forming a variety of circuits, such as an amplification circuit, a charge amplifier, and an operational circuit, for performing predetermined process on the acceleration detection element 200 (sensor portion 210), and as shown in FIG. 1, multiple pads 301, 302 are provided on one surface 300a. The one surface 300a is also referred to as a first surface of the mount member.

The package 100 is configured to include a case 110 and a lid 120. The case 110 is configured using a stacked substrate formed by stacking multiple ceramic layers such as alumina, and has a box shape with a concave portion 130 formed on the one surface 110a. In the present embodiment, the concave portion 130 is formed in the shape of a stepped recess made up of a first concave portion 131 and a second concave portion 132 that is formed on the bottom surface of the first concave portion 131. Further, in the case 110, multiple connection terminals 141 are provided on the bottom surface of the first concave portion 131, and on the outside of the case 110, multiple connection terminals (not shown) are provided. The connection terminal 141 formed on the bottom surface of the first concave portion 131 and the connection terminal formed outside are electrically connected with each other as appropriate via a wiring layer (not shown) formed on the inside the case 110, the wall surface of the concave portion 130, or the like.

The lid 120 is configured using metal or the like, and bonded with the one surface 110a of the case 110 by welding or the like. Thereby, the case 110 is closed up, and the inside of the case 110 is sealed in an airtight manner. In the present embodiment, nitrogen is sealed in the case 110.

The acceleration detection element 200 and the circuit board 300 are then accommodated in the package 100 as thus described. Specifically, the acceleration detection element 200 is mounted on the bottom surface 132a of the second concave portion 132 via an adhesive 151 such that the one surface 210a of the sensor portion 210, the one surface 250a of the cap portion 250, and the arranging direction of the movable electrode 224 and the first and second fixed electrodes 231, 241 are orthogonal to a bottom surface 132a of the second concave portion 132. That is, the acceleration detection element 200 is mounted on the bottom surface 132a of the second concave portion 132 so as to detect acceleration in the normal direction to the bottom surface 132a of the second concave portion 132. In more detail, in the present embodiment, the acceleration detection element 200 is mounted on the bottom surface 132a of the second concave portion 132 such that the side surface 250c (electrodes 259a to 259c) is on the opposite side to the bottom surface 132a side of the second concave portion 132 and parallel to the bottom surface 132a of the second concave portion 132. The bottom surface 132a is also referred to as a first surface of the mount member.

Further, the circuit board 300 is mounted on the bottom surface 132a of the second concave portion 132 via an adhesive 152 such that the one surface 300a is parallel to the bottom surface 132a of the second concave portion 132. The pad 301 of the circuit board 300 is electrically connected with each of the electrodes 259a to 259c of the acceleration detection element 200 via a wire 161. Further, the pad 302 of the circuit board 300 is electrically connected with the connection terminal 141 via a wire 162.

In the present embodiment, the wire 161 corresponds to a conductive member of the present disclosure. Further, the wire 161 for connecting between the pad 301 of the circuit board 300 and each of the electrodes 259a to 259c of the acceleration detection element 200 is formed by wire bonding. Since each of the electrodes 259a to 259c (side surface 250c) and the pad 301 (one surface 300a) are parallel to the bottom surface 132a of the second concave portion 132, load applying directions at the time of wire bonding can be made the same. This can inhibit the complexity of manufacturing process at the time of performing the wire bonding.

The above is the configuration of the acceleration sensor in the present embodiment. Next, a manufacturing method of the acceleration sensor is described with reference to FIGS. 6A to 8B. Although FIGS. 6A to 6D and FIGS. 7A to 7C each show one chip formation region 1 and one dicing line 2 adjacent to the chip formation region 1 in a wafer, in practice, multiple chip formation regions 1 are partitioned by the dicing lines 2.

Figure 6A:
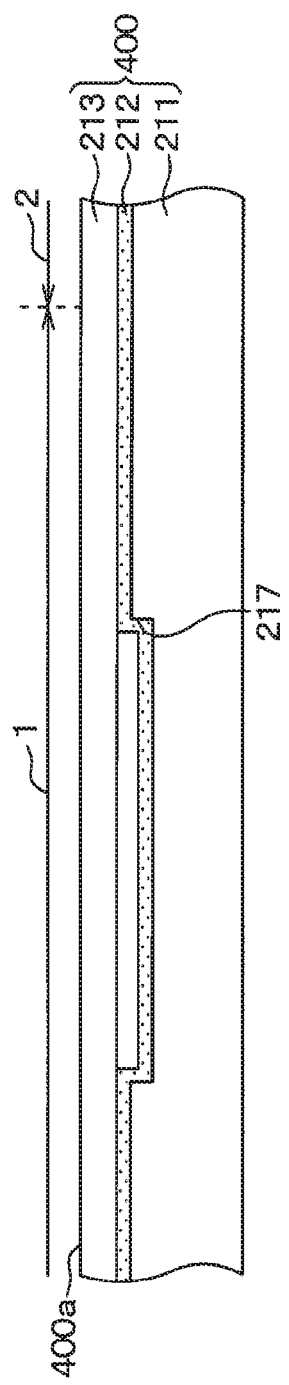
FIG. 6A is a sectional view showing a manufacturing process of the acceleration sensor.

First, as shown in FIG. 6A, a first wafer 400 is prepared as follows. The support substrate 211, the insulating film 212, and the semiconductor layer 213 are sequentially stacked, and one surface 400a is configured on the semiconductor layer 213, while the plurality of chip formation regions 1 are partitioned by the dicing lines 2. The concave portion 217 is formed in each chip formation region 1 in the first wafer 400. As has been known, the concave portion 217 is formed in each chip formation region of the wafer which serves as the support substrate 211, and after formation of the insulating film 212 on the wafer, another wafer configuring the semiconductor layer 213 is bonded, to thereby form the concave portion 217.

Figure 6B:
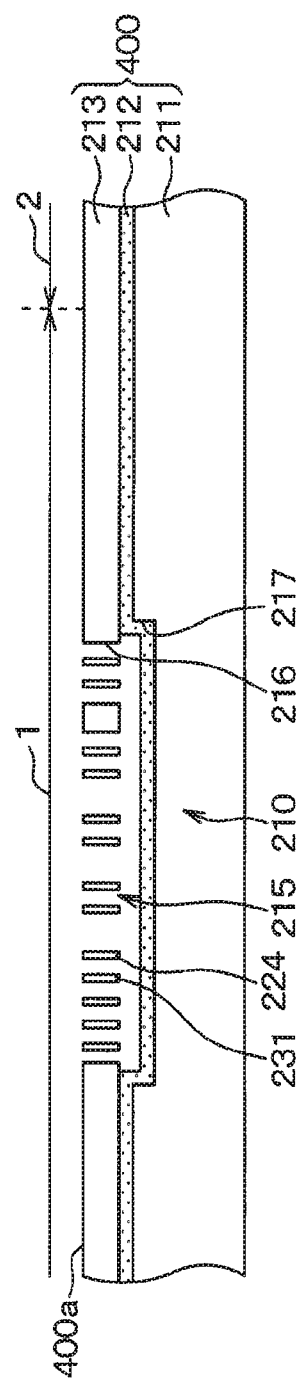
FIG. 6B is a sectional view showing the manufacturing process of the acceleration sensor.

Next, as shown in FIG. 6B, a mask of a resist, an oxide film or the like (not shown) is formed on the one surface 400a of the first wafer 400, and the mask is patterned such that a section corresponding to the groove 216 is opened. For example, the semiconductor layer 213 is etched by RIE (reactive ion etching) technique to form the groove 216, thereby forming the sensing portion 215 that includes the movable portion 220 and the first and second fixed portions 230, 240 described above.

Figure 6C:
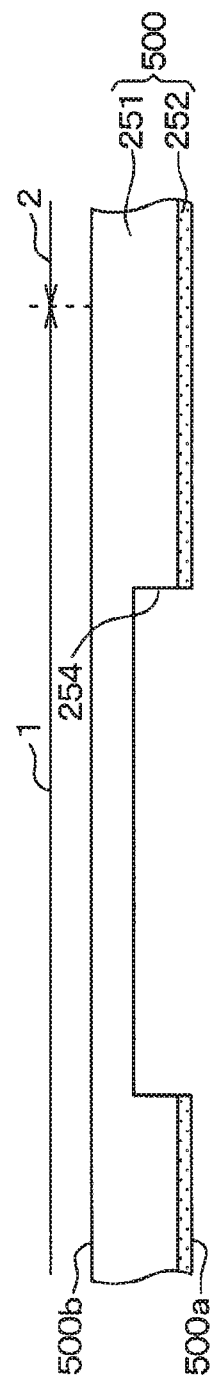
FIG. 6C is a sectional view showing the manufacturing process of the acceleration sensor.

Further, as shown in FIG. 6C, in a separate process from FIGS. 6A and 6B, a second wafer 500 is formed as follows. The insulating film 252 is formed on the one surface 251a of the substrate 251, and one surface 500a is configured on the insulating film 252 while the other surface 500b is configured on the substrate 251. In the second wafer 500, the recess 254 is formed in each chip formation region.

Figure 6D:
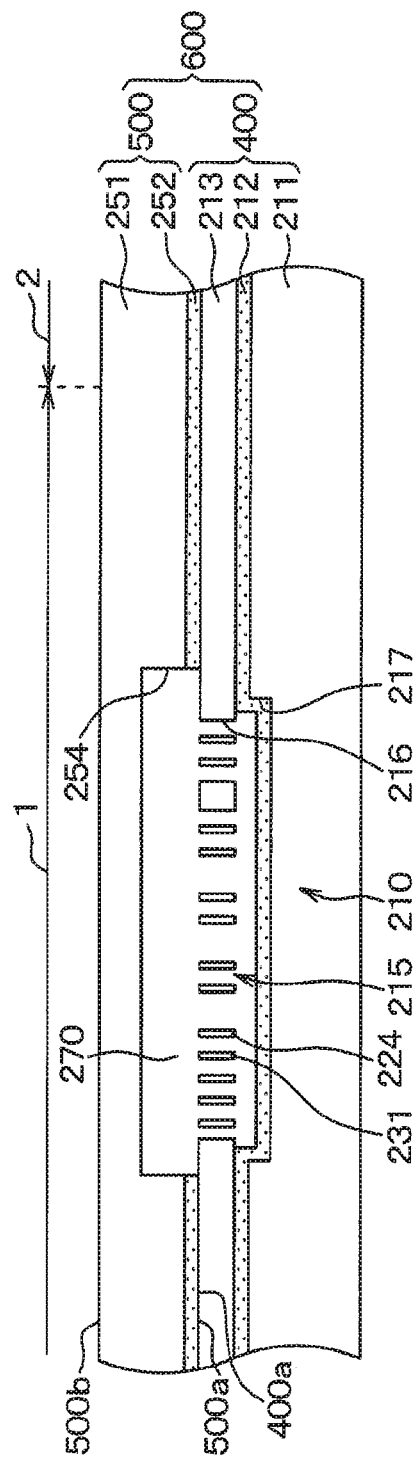
FIG. 6D is a sectional view showing the manufacturing process of the acceleration sensor.

Subsequently, as shown in FIG. 6D, the first wafer 400 is bonded with the second wafer 500 (insulating film 252) to configure a stacked wafer 600. In the present embodiment, first, the one surface 400a (semiconductor layer 213) of the first wafer 400 and the one surface 500a (insulating film 252) of the second wafer 500 are irradiated with an Ar ion beam to activate the respective bonded surfaces. Then, using an alignment mark or the like provided as appropriate on each of the first wafer 400 and the second wafer 500, alignment is performed by use of an infrared microscope or the like, and the first wafer 400 is bonded with the second wafer 500 by so-called direct bonding in which bonding is performed at a low temperature of room temperature to 550° C. Thereby, the airtight chamber 270 is configured between the first wafer 400 and the second wafer 500, and the sensing portion 215 is sealed in the airtight chamber 270.

Figure 7A:
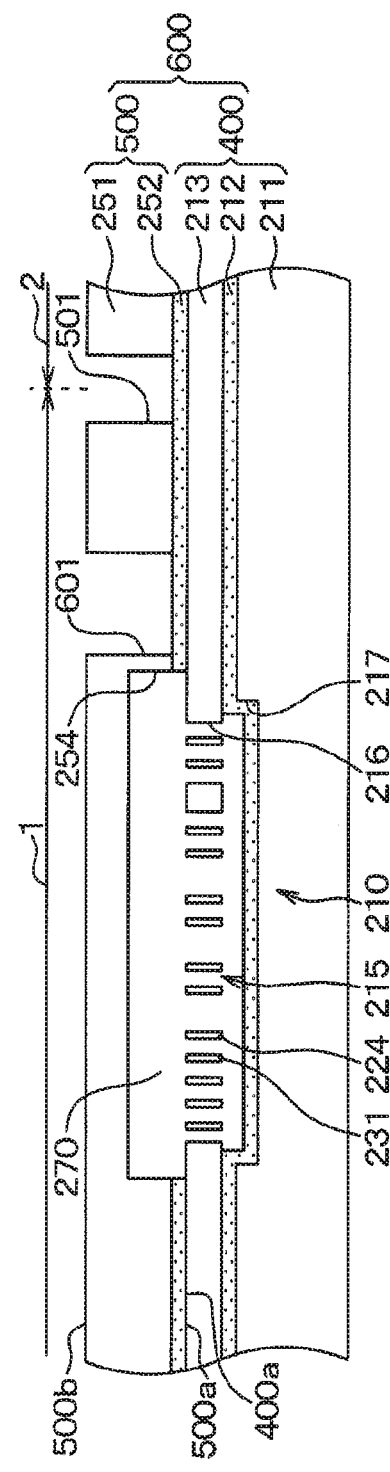
FIG. 7A is a sectional view showing the manufacturing process following FIGS. 6A to 6D.

Next, as shown in FIG. 7A, three holes 501 (not penetrating the insulating film 252) are formed in the second wafer 500 (substrate 251), the holes being astride the chip formation region 1 and the dicing lines 2 and reaching the insulating film 252 (only one of the holes is shown in FIG. 7A). Further, in the second wafer 500 (substrate 251), an upper hole 601 is formed, which reaches the insulating film 252 on the anchor portion 223b and configures a section of the through hole 255a on the opening side. Further, on a different cross section from FIG. 7A, an upper hole is formed, which reaches the insulating film 252 on the first and second wiring portions 232, 242 and configures sections of the through holes 255b, 255c on the opening side.

The three holes 501 configure the above grooves 258a to 258c, and are formed in formation planned regions for the grooves 258a to 258c. In the present embodiment, the three holes 501 are formed in the same process as the upper hole 601 in order to simplify the manufacturing process. However, they may be formed in a separate process from the process for the upper hole 601.

Subsequently, as shown in FIG. 7B, the insulating film 256 such as TEOS is formed on the wall surface of the upper hole 601 and the three holes 501. At this time, the insulating film 253 is made up of an insulating film formed on the other surface 500b of the second wafer 500. Subsequently, the insulating film 256 formed on the bottom surfaces of the upper hole 601 and the three holes 501 are removed. That is, the insulating film 256 formed on the insulating film 252 is removed. Then, a lower hole 602 for exposing the anchor portion 223b is formed on the bottom surface of the upper hole 601. Similarly, on a different cross section from FIG. 7B, a lower hole for exposing part of the first and second wiring portions 232, 242 is formed on the bottom surface of the upper hole. Hence in the second wafer 500, the through hole 255a is configured in the upper hole 601 and the lower hole 602, and the through holes 255b, 255c are configured on the different cross section from FIG. 7B. In the present embodiment, the insulating film 256 is removed in each of the three holes 501 such that the insulating film 252 remains therein. However, the insulating film 256 may not be removed.

Figure 7C:
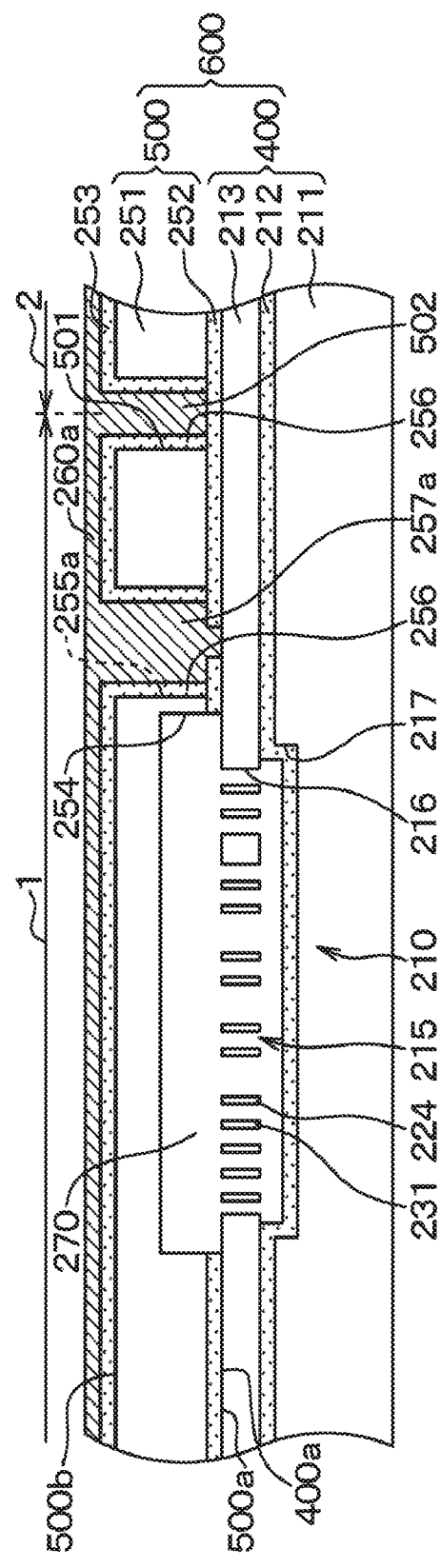
FIG. 7C is a sectional view showing the manufacturing process following FIGS. 6A to 6D.

Next, as shown in FIG. 7C, a film of Al, Al—Si or the like is formed by sputtering, vapor deposition, or the like. Hence the through electrodes 257a to 257c are formed in the respective through holes 255a to 255c, and a metal film 502 is formed in each hole 501. Then, the metal film formed on the insulating film 253 is patterned to form the wiring layers 260a to 260c (only the wiring layer 260a is shown in FIG. 7C) for respectively connecting between the through electrodes 257a to 257c and the metal films 502.

Subsequently, as shown in FIG. 8A, the stacked wafer 600 (first and second wafers 400, 500) is divided into chip units by a dicing blade or the like along the dicing lines. At this time, the wafer is divided into the chip units such that the hole 501 and the metal film 502 are divided. This leads to formation of the acceleration detection element 200 on the side surface 250c of the cap portion 250, in which the grooves 258a to 258c are formed by part of the hole 501 and the electrodes 259a to 259c are formed by the metal film 502.

Figure 8B:
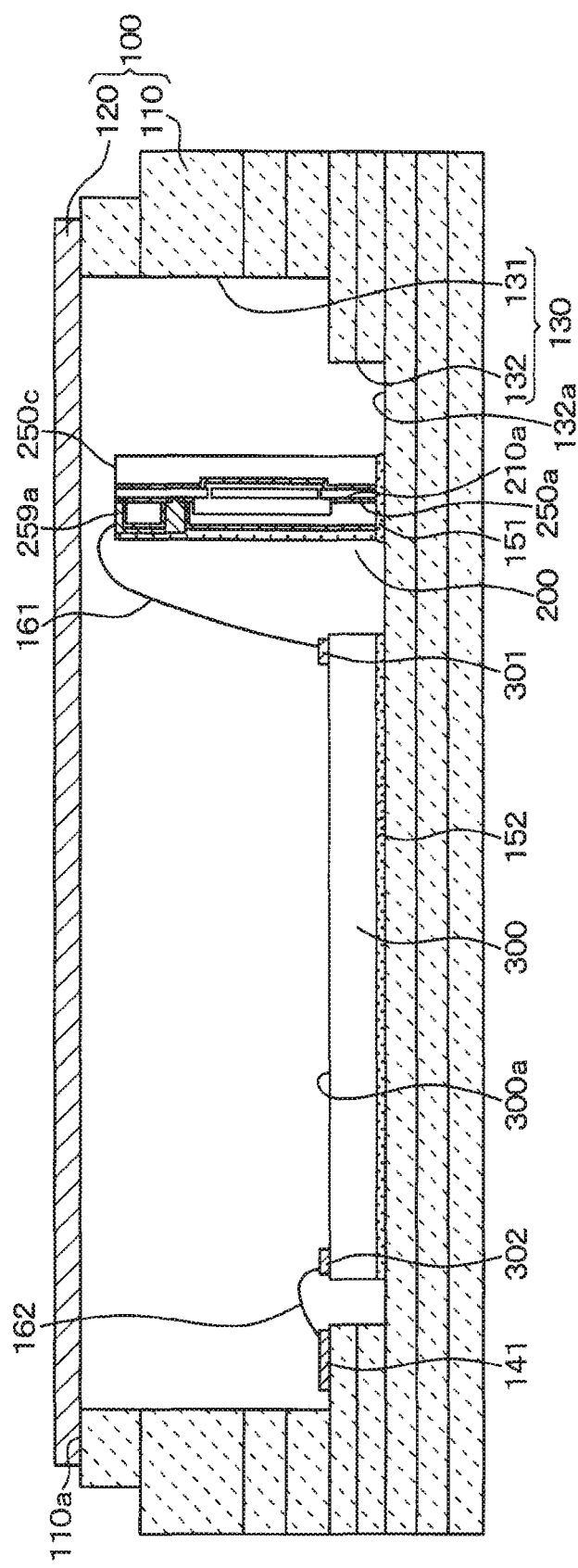
FIG. 8B is a sectional view showing the manufacturing process following FIGS. 7A to 7C.

Subsequently, as shown in FIG. 8B, the case 110 formed with the concave portion 130 is prepared, and the acceleration detection element 200 and the circuit board 300 are mounted on the bottom surface 132a of the second concave portion 132. Specifically, the acceleration detection element 200 is mounted on the bottom surface 132a of the second concave portion 132 via the adhesive 151 such that the one surface 210a of the sensor portion 210, the one surface 250a of the cap portion 250, and the arranging direction of the movable electrode 224 and the first and second fixed electrodes 231, 241 are orthogonal to the bottom surface 132a of the second concave portion 132, and such that the side surface 250c (electrodes 259a to 259c) is on the opposite side to the bottom surface 132a side of the second concave portion 132 and parallel to the bottom surface 132a of the second concave portion 132. Further, the circuit board 300 is mounted on the bottom surface 132a of the second concave portion 132 via the adhesive 152 such that the one surface 300a is parallel to the bottom surface 132a of the second concave portion 132.

The pad 301 of the circuit board 300 is electrically connected with each of the electrodes 259a to 259c of the acceleration detection element 200 via the wire 161. At this time, the wire bonding is performed between the pad 301 of the circuit board 300 and each of the electrodes 259a to 259c of the acceleration detection element 200. Since the side surface 250c (each of the electrodes 259a to 259c) and the one surface 300a (pad 301) are parallel to the bottom surface 132a of the second concave portion 132, the load applying directions at the time of wire bonding can be made the same. This can inhibit the complexity of manufacturing process at the time of performing the wire bonding. Thereafter, the lid 120 is bonded to the one surface 110a of the case 110, to manufacture the acceleration sensor shown in FIG. 1 above.

As described above, in the present embodiment, in the acceleration detection element 200, the movable electrode 224 and the first and second fixed electrodes 231, 241 are both formed in the semiconductor layer 213, to be located on the same plane. Thus, when distortion or durability variation occurs due to a temperature change or the like, it is possible to inhibit the difference in deformation quantity between the movable electrode 224 and each of the first and second fixed electrodes 231, 241, and make characteristic variation unlikely to occur.

Further, the acceleration detection element 200 is mounted on the bottom surface 132a of the second concave portion 132 such that the one surface 210a of the sensor portion 210, the one surface 250a of the cap portion 250, and the arranging direction of the movable electrode 224 and the first and second fixed electrodes 231, 241 are orthogonal to the bottom surface 132a of the second concave portion 132, and such that the side surface 250c (electrodes 259a to 259c) is on the opposite side to the bottom surface 132a side of the second concave portion 132 and parallel to the bottom surface 132a of the second concave portion 132. Moreover, the circuit board 300 is mounted on the bottom surface 132a of the second concave portion 132 such that the one surface 300a is parallel to the bottom surface 132a of the second concave portion 132. Thus, when the wire bonding is to be performed between the pad 301 of the circuit board 300 and each of the electrodes 259a to 259c of the acceleration detection element 200, since the side surface 250c (each of the electrodes 259a to 259c) and the one surface 300a (pad 301) are parallel to the bottom surface 132a of the second concave portion 132, the load applying directions at the time of wire bonding can be made the same. This can inhibit the complexity of manufacturing process at the time of performing the wire bonding.

Further, the acceleration detection element 200 is configured by bonding (stacking) the sensor portion 210 and the cap portion 250. Thus, as compared with the case where the acceleration detection element 200 is made up only of the sensor portion 210, a region to be bonded with the bottom surface 132a of the second concave portion 132 can be easily ensured, to thereby inhibit the acceleration detection element 200 from falling down.

(Second Embodiment)

A second embodiment is described. The present embodiment is obtained by changing the disposing method for the acceleration detection element 200 with respect to the first embodiment. The other respects are similar to those in the first embodiment, and descriptions thereof are omitted here.

Figure 9:
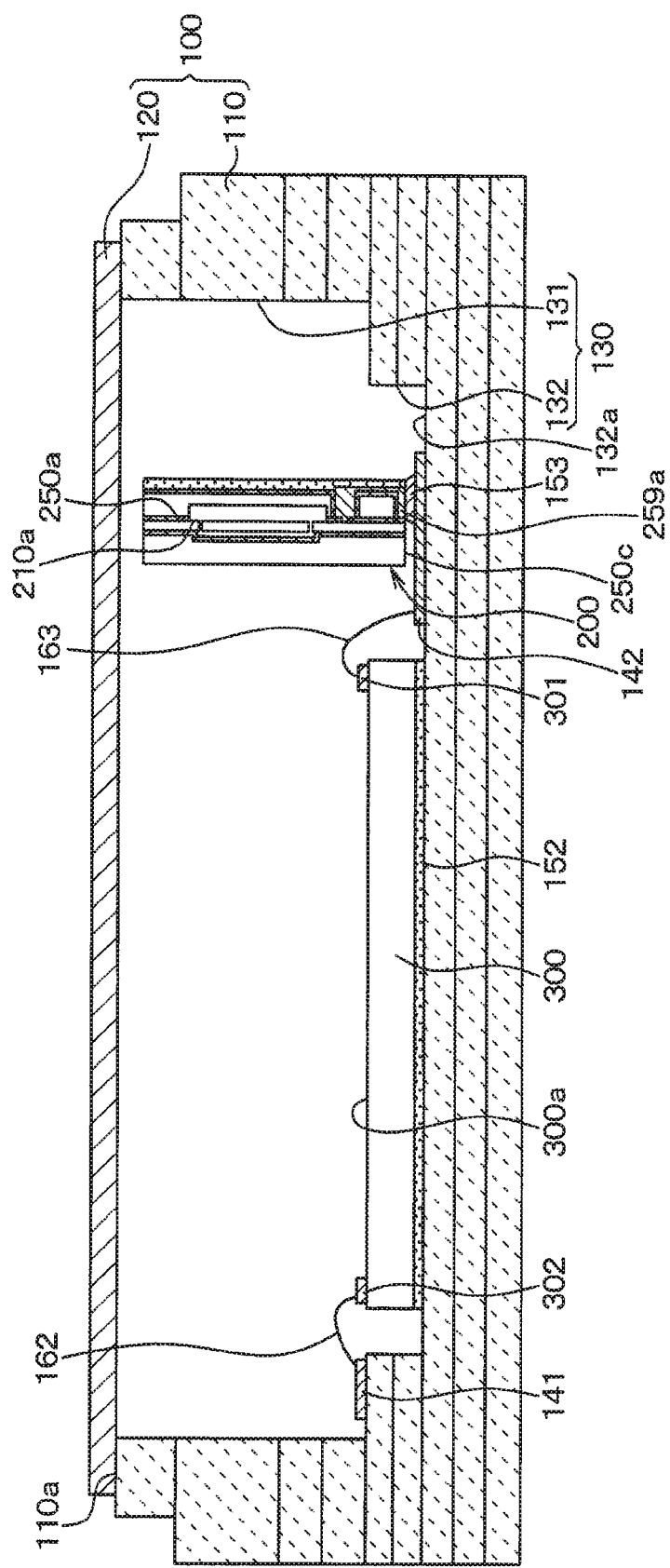
FIG. 9 is a sectional view of an acceleration sensor in a second embodiment of the present disclosure.

In the present embodiment, as shown in FIG. 9, multiple connection terminals 142 (only one terminal is shown in FIG. 9) are formed in a predetermined place on the bottom surface 132a of the second concave portion 132. The acceleration detection element 200 is disposed such that the side surface 250c opposes the bottom surface 132a of the second concave portion 132, and the electrode 259a is electrically and mechanically connected with the connection terminal 142 via a solder layer 153 as the conductive member. On a different cross section from FIG. 9, the electrodes 259b, 259c are electrically and mechanically connected with a different connection terminal 142 from the connection terminal 142 shown in FIG. 9 via the solder layer 153. The pad 301 of the circuit board 300 is electrically connected with each connection terminal 142 via a wire 163 as the conductive member.

This eliminates the need to perform the wire bonding on the acceleration detection element 200, thereby allowing inhibition of the destruction of the acceleration detection element 200. That is, as shown in FIG. 9, a length of the acceleration detection element 200 in the direction along the stacking direction tends to be longer than a length thereof in the direction along the arranging direction of the movable electrode 224 and the first and second fixed electrodes 231, 241. In a case where the acceleration detection element 200 is disposed such that the arranging direction of the movable electrode 224 and the first and second fixed electrodes 231, 241 is orthogonal to the bottom surface 132a of the second concave portion 132, when the wire bonding is performed on the acceleration detection element 200, the acceleration detection element 200 tends to wobble due to vibration at the time of performing the wire bonding. Thus, the wire bonding is performed between the pad 301 of the circuit board 300 and the connection terminal 142 which are stably disposed, thereby allowing inhibition of the destruction of the acceleration detection element 200.

Since the electrodes 259a to 259c are disposed on the side surface 250c, the acceleration detection element 200 can be easily connected to the connection terminal 142 via the solder layer 153 so that the acceleration in the normal direction to the bottom surface 132a of the second concave portion 132 can be detected.

(Third Embodiment)

A third embodiment is described. The present embodiment is obtained by changing the disposing method for the acceleration detection element 200 with respect to the first embodiment. The other respects are similar to those in the first embodiment, and descriptions thereof are omitted here.

Figure 10:
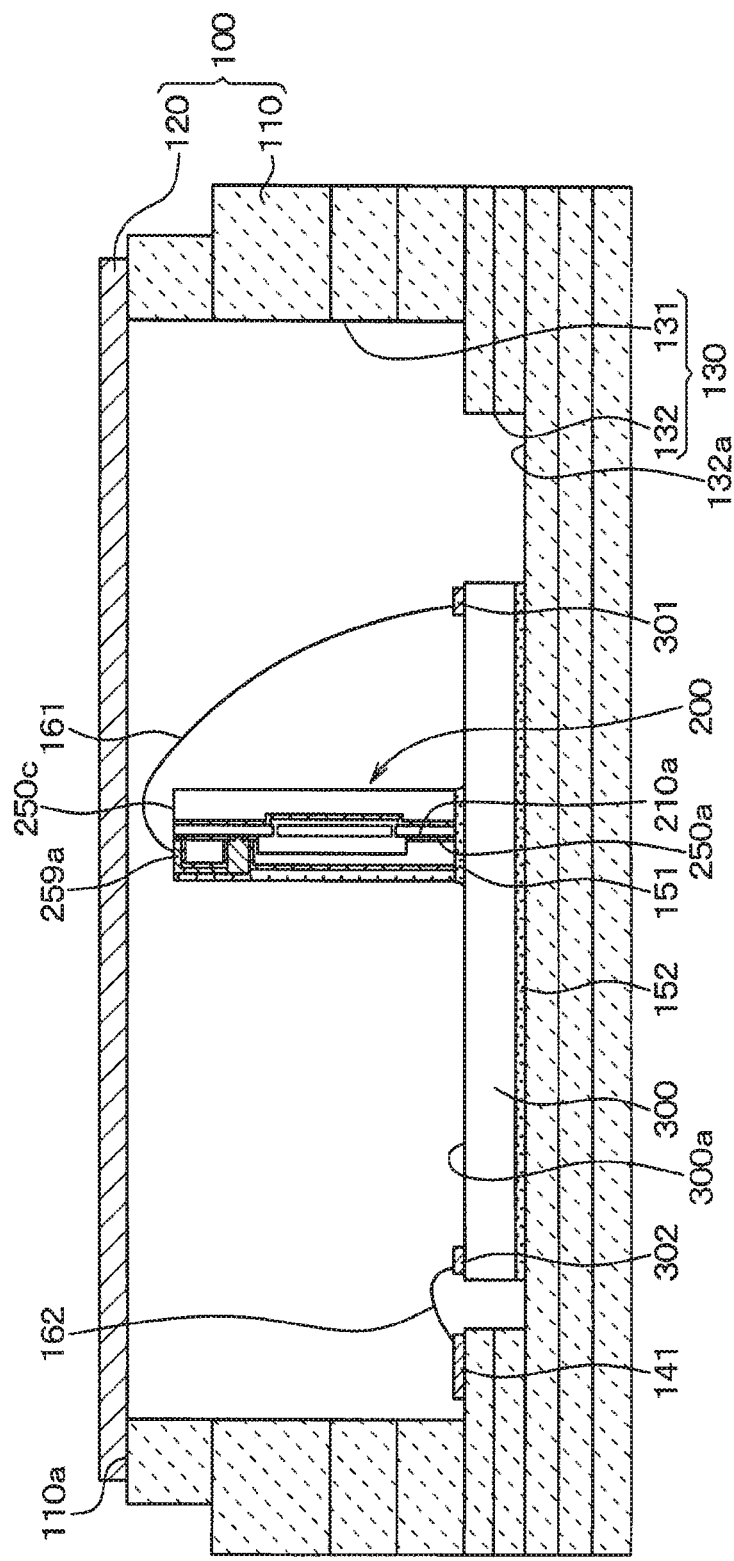
FIG. 10 is a sectional view of an acceleration sensor in a third embodiment of the present disclosure.

In the present embodiment, as shown in FIG. 10, the acceleration detection element 200 is mounted on the circuit board 300 via the adhesive 151. Specifically, the acceleration detection element 200 is mounted on the circuit board 300 such that the one surface 210a of the sensor portion 210, the one surface 250a of the cap portion 250, and the arranging direction of the movable electrode 224 and the first and second fixed electrodes 231, 241 are orthogonal to the one surface 300a of the circuit board 300, and such that the side surface 250c (electrodes 259a to 259c) is on the opposite side to the one surface 300a of the circuit board 300 and parallel to the one surface 300a of the circuit board 300. That is, in the present embodiment, the circuit board 300 corresponds to a mount member of the present disclosure, and the one surface 300a of the circuit board 300 corresponds to one surface of the mount member of the present disclosure.

Accordingly, with the acceleration detection element 200 mounted on the circuit board 300, it is possible to reduce the size in the surface direction on the bottom surface 132a of the second concave portion 132, and thereby to attempt downsizing.

(Fourth Embodiment)

A fourth embodiment is described. The present embodiment is obtained by changing the disposing method for the acceleration detection element 200 with respect to the first embodiment. The other respects are similar to those in the first embodiment, and descriptions thereof are omitted here.

Figure 11:
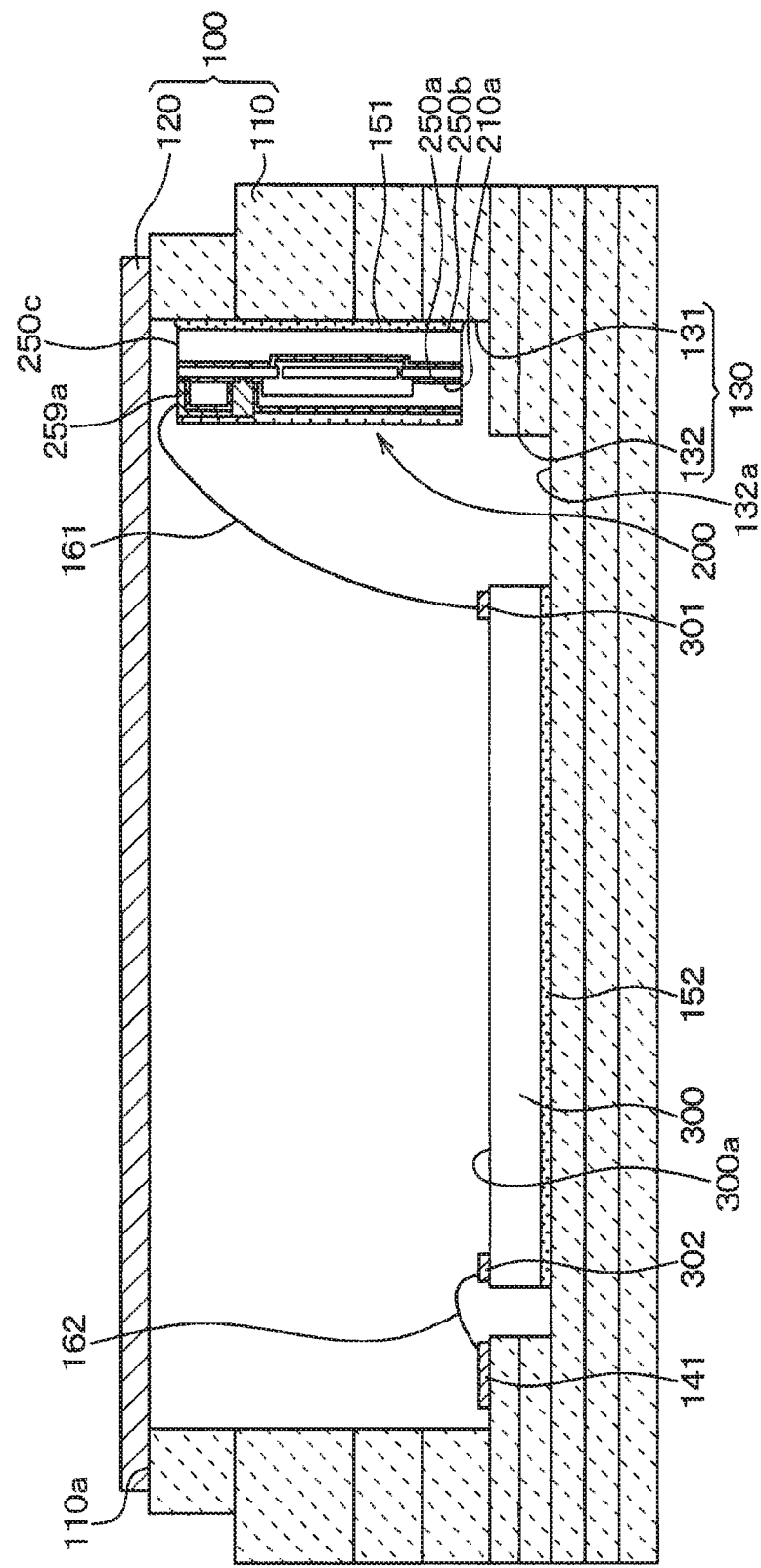
FIG. 11 is a sectional view of an acceleration sensor in a fourth embodiment of the present disclosure.

In the present embodiment, as shown in FIG. 11, in the acceleration detection element 200, the other surface 210b of the sensor portion 210 is mounted on the side surface of the first concave portion 131 via the adhesive 151. Similarly to the above first embodiment, the acceleration detection element 200 is mounted such that the one surface 210a of the sensor portion 210, the one surface 250a of the cap portion 250, and the arranging direction of the movable electrode 224 and the first and second fixed electrodes 231, 241 are orthogonal to the bottom surface 132a of the second concave portion 132, and such that the side surface 250c (electrodes 259a to 259c) is on the opposite side to the bottom surface 132a side of the second concave portion 132 and parallel to the bottom surface 132a of the second concave portion 132. Further, in the present embodiment, the adhesive 151 corresponds to a bonding member of the present disclosure.

Accordingly, the acceleration detection element 200 is fixed to the case 110 on the other surface 210b having a wide area. This can inhibit wobbling of the acceleration detection element 200 due to vibration at the time of performing the wire bonding between the pad 301 of the circuit board 300 and each of the electrodes 259a to 259c of the acceleration detection element 200, to thereby inhibit the destruction of the acceleration detection element 200.

(Fifth Embodiment)

A fifth embodiment is described. The present embodiment is obtained by changing the manufacturing method of the acceleration detection element 200 with respect to the first embodiment. The other respects are similar to those in the first embodiment, and descriptions thereof are omitted here.

Figure 12A:
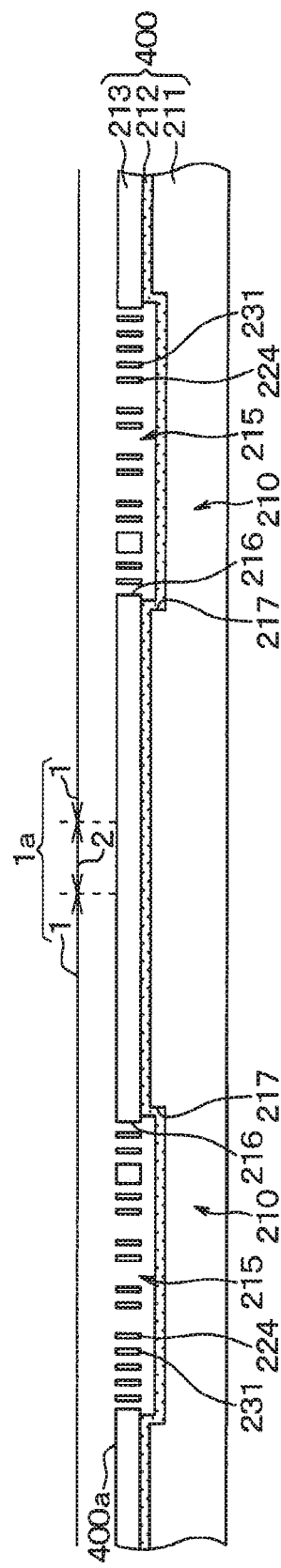
FIG. 12A is a sectional view showing a manufacturing process of an acceleration detection element in a fifth embodiment of the present disclosure.

In the present embodiment, as shown in FIG. 12A, when adjacent chip formation regions 1 are taken as a pair 1a, in the process of FIG. 6B, the movable portion 220 and the first and second fixed portions 230, 240 in each pair 1a are formed so as to be symmetrical with respect to the dicing line 2 between the adjacent chip formation regions 1.

Figure 12B:
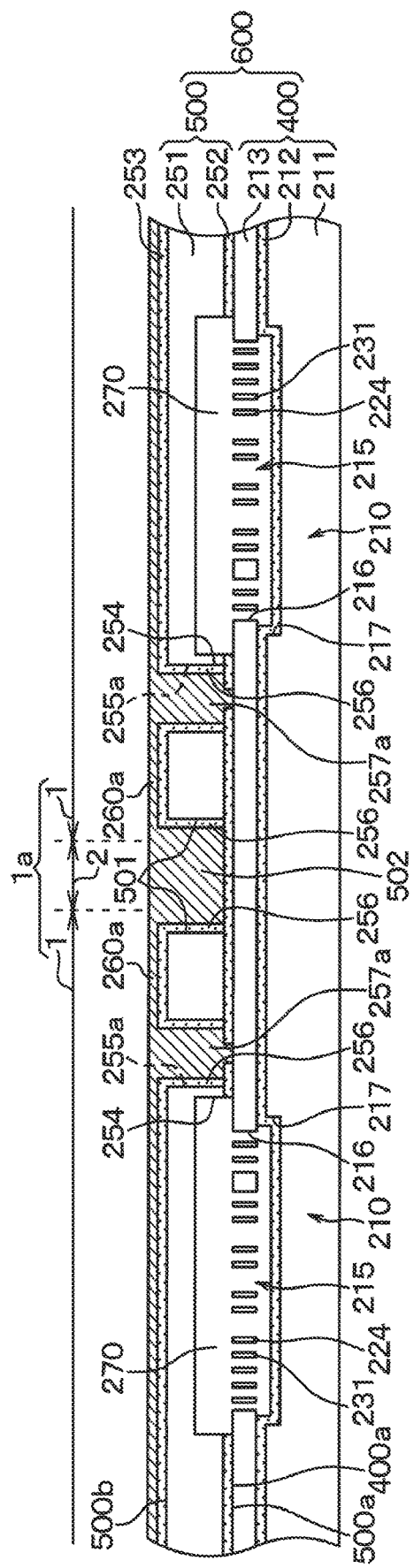
FIG. 12B is a sectional view showing the manufacturing process of the acceleration detection element in the fifth embodiment of the present disclosure.

Then, as shown in FIG. 12B, in the process of forming the hole 501 in FIG. 7A above, the hole 501 astride each chip formation region 1 and the dicing lines 2 is formed so as to be shared between the adjacent chip formation regions 1.

Figure 12C:
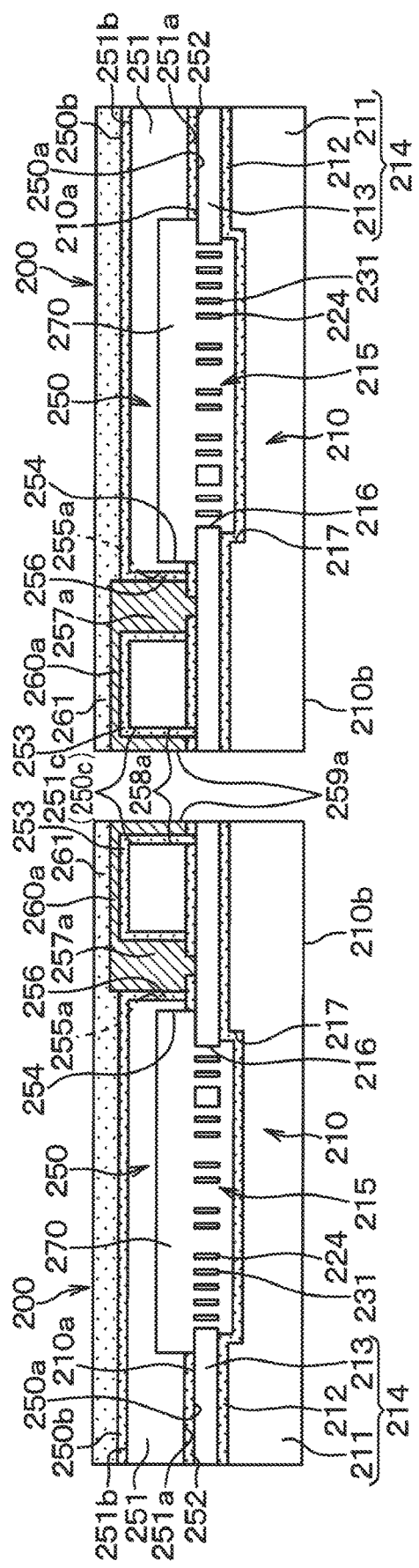
FIG. 12C is a sectional view showing the manufacturing process of the acceleration detection element in the fifth embodiment of the present disclosure.

Thereafter, as shown in FIG. 12C, the stacked wafer 600 (first and second wafers 400, 500) is divided into chip units by the dicing blade or the like along the dicing lines. At this time, the wafer is divided into the chip units such that the hole 501 and the metal film 502 are divided in each chip formation region. That is, the wafer is divided into the chip units such that in the hole 501, the grooves 258a to 258c of the one acceleration detection element 200 are configured, and the grooves 258a to 258c of the other acceleration detection element 200 are also configured, and such that in the metal film 502, the electrodes 259a to 259c of the one acceleration detection element 200 are configured, and the electrodes 259a to 259c of the other acceleration detection element 200 are also configured.

Accordingly, the hole 501 and the metal film 502 are shared in the adjacent pair 1a, thereby enabling reduction in unnecessary section in the wafer as compared with the case of forming the hole 501 and the metal film 502 in each chip formation region 1.

(Other Embodiments)

The present disclosure is not restricted to the embodiments described above, but can be changed as appropriate within the scope described in the present disclosure.

In each of the above embodiments, for example, the sensing portion 215 for detecting an angular velocity may be formed in the sensor portion 210. That is, the present disclosure is also applicable to an angular velocity sensor for detecting an angular velocity. Since the detection element including the sensor portion 210 as thus described detects an angular velocity while the sensing portion 215 is vibrated, as in the above third embodiment, the sensor portion 210 and the circuit board 300 can be disposed separately from each other by mounting the sensor portion 210 on the wall surface of the first concave portion 131, thereby to inhibit the vibration of the sensing portion 215 from becoming noise for the circuit board 300.

The example has been described in each of the above embodiments where the acceleration detection element 200 and the circuit board 300 are electrically connected with each other via the wire 161. However, the acceleration detection element 200 and the circuit board 300 may be electrically connected with each other via a conductive member such as a printed circuit board.

The example has been described in each of the above embodiments where the acceleration detection element 200 and the circuit board 300 are electrically connected with each other via the wire 161. However, the mount member may include a circuit portion such as a printed circuit board. In this case, the acceleration detection element 200 is electrically connected with the printed circuit board as the mount member.

It is also possible to appropriately combine each of the above embodiments. For example, the second embodiment and the third embodiment may be combined, and the acceleration detection element 200 may be disposed such that the side surface 250c (electrodes 259a to 259c) is located on the circuit board 300 side, and the pad 301 and the electrodes 259a to 259c are electrically and mechanically connected with each other via the solder layer 153.

In the above, the embodiments, configurations, arid aspects of the physical quantity sensor and manufacturing method therefor according to the present disclosure have been illustrated. However, the embodiments, configurations, and aspects according to the present disclosure are not restricted to the foregoing embodiments, configurations, and aspects. For example, an embodiment, configuration, and aspect obtained by appropriately combining technical portions respectively disclosed in different embodiments, configurations, and aspects are also included in the scopes of the embodiment, configuration, and aspect according to the present disclosure.

The invention claimed is:

1. A physical quantity sensor that is configured to detect at least one of acceleration or angular velocity, the physical quantity sensor comprising:
a detection element that outputs a sensor signal in accordance with at least one of acceleration or angular velocity as a physical quantity; and
a mount member on which the detection element is mounted, wherein:
the detection element includes
a sensor portion that has a first surface and that includes a movable electrode and a fixed electrode, the movable electrode is displaceable in a surface direction of the first surface in accordance with a physical quantity, the surface direction extends parallel to the first surface of the sensor portion, and the fixed electrode is disposed to oppose the movable electrode in the surface direction of the first surface, and the sensor portion outputs the sensor signal based on a capacitance between the movable electrode and the fixed electrode, and
a cap portion that has a first surface and that is bonded with the sensor portion in a state where the first surface of the cap portion opposes the first surface of the sensor portion;
each of the first surface of the sensor portion and the first surface of the cap portion is mounted on the mount member so as to be orthogonal to a first surface of the mount member, and the detection element detects the physical quantity in a normal direction to the first surface of the mount member; and
a first electrode, which is electrically connected with the movable electrode and electrically connected with a circuit portion to perform a predetermined process, and a second electrode, which is electrically connected with the fixed electrode and electrically connected with the circuit portion, are provided on a side surface of the cap portion adjacent to the first surface of the cap portion and parallel to the first surface of the mount member, wherein:
the side surface of the cap portion adjacent to the first surface of the cap portion and parallel to the first surface of the mount member includes a first side surface and a second side surface,
the first side surface of the cap portion is farther from the first surface of the mount member than the second side surface of the cap portion,
the first electrode and the second electrode are located on the first side surface of the cap portion, and
each of the first electrode and the second electrode is electrically connected with the circuit portion via each conductive member.

2. The physical quantity sensor according to claim 1, wherein:
the mount member is a circuit board on which the circuit portion is provided.

3. The physical quantity sensor according to claim 1, wherein:
the mount member is a package including a concave portion, and the first surface of the mount member is a bottom surface of the concave portion; and
the detection element is mounted on a side surface of the mount member, the side surface of the mount member being adjacent to the bottom surface of the concave portion via a bonding member.

4. The physical quantity sensor according to claim 1, wherein:
the cap portion includes a movable-electrode through hole and a fixed-electrode through hole that penetrate the cap portion in a stacking direction of the cap portion and the sensor portion, the movable-electrode through hole exposes a movable-electrode connection portion connected with the movable electrode, and the fixed-electrode through hole exposes a fixed-electrode connection portion connected with the fixed electrode,
the detection element includes a movable-electrode through electrode that is electrically connected with the movable-electrode connection portion of the cap portion, the movable-electrode through electrode being located in the movable-electrode through hole,
the detection element includes a fixed-electrode through electrode that is electrically connected with the fixed-electrode connection portion, the fixed-electrode through electrode being located in the fixed-electrode through hole, and
the cap portion includes a second surface opposite to the first surface of the cap portion,
the second surface of the cap portion includes a movable-electrode wiring portion for electrically connecting the movable-electrode through electrode and the first electrode, and
the second surface of the cap portion includes a fixed-electrode wiring portion for electrically connecting the fixed-electrode through electrode and the second electrode.

5. The physical quantity sensor according to claim 1, further comprising:
a protective film that covers each through electrode and each electrode wiring portion.

6. A manufacturing method of a physical quantity sensor that is configured to detect at least one of acceleration or angular velocity, the sensor comprising:
a detection element that outputs a sensor signal in accordance with at least one of acceleration or angular velocity as a physical quantity; and
a mount member on which the detection element is mounted, wherein:
the detection element includes
a sensor portion that has a first surface and that includes a movable electrode and a fixed electrode, the movable electrode is displaceable in a surface direction of the first surface in accordance with a physical quantity, the surface direction extends parallel to the first surface of the sensor portion, and the fixed electrode is disposed to oppose the movable electrode in the surface direction of the first surface, and the sensor portion outputs the sensor signal based on a capacitance between the movable electrode and the fixed electrode, and a cap portion that has a first surface and that is bonded with the sensor portion in a state where the first surface of the cap portion opposes the first surface of the sensor portion;

each of the first surface of the sensor portion and the first surface of the cap portion is mounted on the mount member so as to be orthogonal to a first surface of the mount member, and the detection element detects the physical quantity in a normal direction to the first surface of the mount member; and a first electrode, which is electrically connected with the movable electrode and electrically connected with a circuit portion to perform a predetermined process, and a second electrode, which is electrically connected with the fixed electrode and electrically connected with the circuit portion, are provided on a side surface of the cap portion adjacent to the first surface of the cap portion and parallel to the first surface of the mount member, the manufacturing method comprising:

preparing a stacked wafer in which a first wafer is bonded to a second wafer, the first wafer includes the sensor portion and the second wafer includes the cap portion, the stacked wafer includes a plurality of chip formation regions that are each demarcated by a dicing line, each of the plurality of chip formation regions includes the movable electrode and the fixed electrode;

dicing the stacked wafer along the dicing line to form the detection element having the sensor portion and the cap portion;

mounting the detection element on the first surface of the mount member such that each of the first surface of the sensor portion and the first surface of the cap portion is orthogonal to the first surface of the mount member, and the physical quantity in the normal direction to the first surface of the mount member is detected; and forming, on the second wafer, a hole portion that extends across both the chip formation regions and the dicing line and forming a metal film in the hole portion, after the preparation of the stacked wafer, wherein:

in the formation of the detection element, the dicing is performed to divide the hole portion and the metal film, to form the first electrode and the second electrode on the side surface adjacent to the first surface of the cap portion in the detection element.

7. The manufacturing method of the physical quantity sensor according to claim 6, wherein:

in the formation of the stacked wafer, the movable electrode and the fixed electrode provided in one of two adjacent chip formation regions and the movable electrode and the fixed electrode provided in another of the two adjacent chip formation regions are provided to be symmetrical with the dicing line;

in the formation of the hole portion, the hole portion extends across one of the chip formation regions, the dicing line, and another of the chip formation regions; and in the formation of the detection element, the stacked wafer is diced along the dicing line, to provide the first electrode in one of the detection elements and form the second electrode in another of the detection elements, from the metal film.

\* \* \* \* \*